(12) United States Patent
Dangelmaier et al.

(10) Patent No.: US 7,911,041 B2
(45) Date of Patent: Mar. 22, 2011

(54) SEMICONDUCTOR DEVICE WITH GOLD COATINGS, AND PROCESS FOR PRODUCING IT

(75) Inventors: Jochen Dangelmaier, Beratzhausen (DE); Donald Fowlkes, San Jose, CA (US); Volker Guengerich, Regensburg (DE); Henrik Hoyer, Los Gatos, CA (US)

(73) Assignee: Infineon Technologies AG (DE)

( * ) Notice: Subject to any disclaimer, the term of this patent is extended or adjusted under 35 U.S.C. 154(b) by 931 days.

(21) Appl. No.: 11/351,933

(22) Filed: Feb. 9, 2006

(65) Prior Publication Data

US 2006/0175691 A1   Aug. 10, 2006

(30) Foreign Application Priority Data

Feb. 10, 2005 (DE) .......... 10 2005 006 281

(51) Int. Cl.
*H01L 23/495* (2006.01)
(52) U.S. Cl. .......... 257/677; 257/735; 257/751
(58) Field of Classification Search .......... 257/677, 257/736, 735, E23.185
See application file for complete search history.

(56) References Cited

U.S. PATENT DOCUMENTS

| | | | |
|---|---|---|---|
| 4,772,935 A | 9/1988 | Lawler et al. | 357/71 |
| 4,880,708 A | 11/1989 | Sharma et al. | 428/620 |
| 5,454,929 A | 10/1995 | Kinghorn | 205/128 |
| 5,583,379 A * | 12/1996 | Sato et al. | 257/736 |
| 5,622,305 A | 4/1997 | Bacon et al. | 228/123.1 |
| 5,767,574 A * | 6/1998 | Kim et al. | 257/677 |
| 5,818,105 A | 10/1998 | Kouda | 257/696 |
| 5,889,317 A * | 3/1999 | Huang et al. | 257/666 |
| 6,127,727 A | 10/2000 | Eytcheson | 257/692 |
| 6,150,711 A * | 11/2000 | Kom et al. | 257/677 |
| 6,206,269 B1 | 3/2001 | Olofsson | 228/123.1 |
| 6,211,463 B1* | 4/2001 | Fabis | 174/548 |
| 7,053,299 B2* | 5/2006 | Zimmerman | 174/528 |
| 2004/0140539 A1* | 7/2004 | Abbott | 257/666 |
| 2004/0183166 A1* | 9/2004 | Abbott | 257/666 |
| 2005/0189622 A1* | 9/2005 | Humpston et al. | 257/659 |
| 2006/0169751 A1* | 8/2006 | Henneken et al. | 228/208 |

FOREIGN PATENT DOCUMENTS

| | | |
|---|---|---|
| EP | 0 337 015 B1 | 12/1988 |
| EP | 1 167 582 B1 | 6/2001 |
| EP | 1 298 726 A2 | 10/2002 |
| JP | 2000244084 | 9/2000 |
| WO | WO 96/27282 | 9/1996 |
| WO | WO 03/043081 A2 | 5/2003 |

* cited by examiner

*Primary Examiner* — Benjamin P Sandvik
*Assistant Examiner* — Krista Soderholm
(74) *Attorney, Agent, or Firm* — Banner & Witcoff, Ltd.

(57) ABSTRACT

A semiconductor device (7) has gold coatings (1 to 5) which are applied to metallic or ceramic components (6) of the semiconductor device (7). The gold coatings (1 to 4) have a multifunctional multilayer metal coating (8) with a minimal gold layer (9). The gold layer has a thickness $d_G$ where $d_G \leq 0.5$ μm. Moreover, at least one metallic interlayer (10) is arranged between the gold layer (9) and the metallic or ceramic components (6).

26 Claims, 4 Drawing Sheets

SEMICONDUCTOR DEVICE WITH GOLD COATINGS, AND PROCESS FOR PRODUCING IT

PRIORITY

This application claims priority from German Patent Application No. DE 10 2005 006 281.4, which was filed on Feb. 10, 2005, and is incorporated herein by reference in its entirety.

TECHNICAL FIELD

The invention relates to a semiconductor device with gold coatings on metallic or ceramic components of the semiconductor device. Gold coatings on top surfaces of semiconductor device components are sometimes required in order to protect the metallic layers below from corrosion, oxidation and/or sulfidation. This applies in particular to outer contacts which project out of a plastic housing of a semiconductor device.

BACKGROUND

However, these gold coatings, in a thickness of between 2.5 µm and 5 µm, are disruptive to the soldering process, especially since the gold can form intermetallic, brittle phases with the applied soldering tin, making the soldered join more brittle. Therefore, the user or purchaser is forced to remove the gold coating before soldering the outer contacts onto a higher-level printed circuit board. On the other hand, the outer terminals or outer contacts, which predominantly comprise copper or copper alloys, of a semiconductor device without the gold protection would have a very limited storage life, since the copper becomes tarnished, and the tarnished layer of copper oxide and copper sulfide cannot be reliably wetted.

Moreover, gold coatings are used on components of the semiconductor device on which the back surfaces of semiconductor chips are to be secured. In these cases, gold layers with a thickness of from 2.5 µm to 5 µm have likewise proven suitable for achieving a reliable eutectic fused join between the gold coating and the silicon of the back surface of the semiconductor chip. Furthermore, in a semiconductor device gold coatings on contact terminal surfaces of wiring structures in a thickness of from 2.5 µm to 5 µm are used to attach bonding wires via eutectic fusion with the aluminum of the bonding wires.

Internal flat conductors in conventional devices also have a gold coating of this type with a thickness of over 2.5 µm, so as to ensure that the bonding wire coming from the contact surfaces of the semiconductor chip can be bonded onto contact terminal surfaces of a flat conductor. With regard to the thickness of the layers, it is attempted to save on production costs by applying the gold selectively to the locations of the components at which a gold coating is required. However, it has been found that alignment and selective application of a gold coating of this type forces the manufacturing costs upwards.

SUMMARY

It is an object of the invention to provide, for components with a multilayer coating, a gold layer which can be applied to the semiconductor components over a large area without having to carry out selective intermediate steps yet which nevertheless reduces the production costs. A further object of the invention is to provide a process for producing a semiconductor device with gold coatings.

This object can be achieved by a semiconductor device with gold coatings on metallic or ceramic components of the semiconductor device, the gold coatings comprising a multifunctional multilayer metal coating with a minimal gold layer, wherein the gold layer comprises a thickness $d_G$ where $d_G \leq 0.5$ µm, and at least one metallic interlayer is arranged between the gold layer and the metallic or ceramic components.

The multilayer metal coating may comprise an interlayer of diffusion-inhibiting material. The multilayer metal coating as interlayers may comprise a layer sequence made up of nickel with a thickness $d_N$ and palladium with a thickness $d_P$, where 3 µm $\leq d_N \leq$ 5 µm and 0.1 µm $\leq d_P \leq$ 0.3 µm. The multilayer metal coating as interlayer may comprise a layer of NiCo with a thickness of 3 µm $\leq d_{NiCo} \leq$ 5 µm. The semiconductor device can be a radiofrequency power device with a cavity housing and a metallic base region, the metallic base regions comprising the multilayer metal coating with gold layer. The metallic base region may comprise a base flange which is soldered into a cavity housing frame, wherein the base flange comprises copper and/or a copper alloy, the base flange comprising the multilayer metal coating with gold layer on its surface which faces the cavity housing frame. The base flange may comprise the multilayer metal coating with gold layer on its surface which faces a semiconductor chip. The device component may comprise the multilayer metal coating with gold layer on its surface assigned to the base flange. The base flange may comprise an alloy of copper and tungsten. The base flange may comprise an alloy of copper and molybdenum. The cavity housing may comprise flat conductors, which are arranged in the cavity and can be embedded in a cavity housing frame and which may project out of the cavity housing frame, the flat conductors comprising copper and/or a copper alloy and having the multilayer metal coating with gold layer. The semiconductor device can be solderable, by way of its flat conductors comprising copper and/or a copper alloy with multilayer metal coating and gold layer, onto a higher-level printed circuit board. The cavity housing may comprise plastic. The semiconductor device may comprise a housing with plastic frame. The cavity housing may comprise ceramic. The semiconductor device may comprise a housing with ceramic frame.

The object can also be achieved by a process for producing a semiconductor device with gold coatings, which comprises the following process steps of producing metallic or ceramic components of a semiconductor device; multilayer coating of the top surfaces of the components with at least one metallic interlayer; applying a gold layer in a thickness $d_G$ where $d_G \leq 0.5$ µm to surfaces of the metallic interlayer; and assembly of the semiconductor device using the components with gold layer.

The top surfaces can be cleaned with an alcohol prior to the multilayer coating of the top surfaces of the components with at least one metallic interlayer. The top surfaces can be sensitized by means of glow discharge techniques prior to the multilayer coating of the top surfaces of the components with at least one metallic interlayer. A plasma pretreatment of the surface of the metallic components by means of metal ion treatment can be carried out prior to application of an interlayer. Highly active PVD processes can be used for the multilayer coating of the top surfaces of metallic components with at least one metallic interlayer. To apply the base flange to a cavity housing frame, a solder layer can be applied by electrodeposition to the gold layer. Ni can be applied in a thickness $d_N$ where 3 µm≦$d_N$≦5 µm as a first interlayer. Pd can be applied to the first interlayer, in a thickness $d_P$ where 0.1 µm≦$d_P$≦0.3 µm, as a second interlayer. Au can be applied in a thickness $d_G$≦0.5 µm, preferably where 0.3 µm≦$d_G$≦0.5 µm, as a gold layer. An interlayer of NiCo with a thickness $d_{NiCo}$ where 3 µm≦$d_{NiCo}$≦5 µm can be applied as diffusion barrier layer.

The invention provides a semiconductor device with gold coatings on metallic or ceramic components of the semiconductor device, the gold coatings comprising a multifunctional multilayer metal coating with a minimal gold layer. The gold layer in this case has a thickness $d_G$ where $d_G$≦0.5 µm. Moreover, at least one metallic interlayer is arranged between the gold layer and the metallic or ceramic components.

This semiconductor device with gold coatings has the advantage that the thickness $d_G$, where $d_G$≦0.5 µm, allows both bonding of semiconductor chips to gold coatings of this type on a chip island of a leadframe and attachment of bonding wires to gold coatings of this type, and moreover this thickness is sufficient to protect outer contact surfaces and outer contacts of the semiconductor device from corrosion, oxidation and/or sulfidation without the thin gold layer impeding a subsequent soldering operation or leading to embrittlement of the solder tin.

A further advantage of this semiconductor device is that the gold coatings do not have to be applied selectively, since with this gold coating it is possible both to wet tin solders and to carry out the conventional bonding operations for applying semiconductor chips or for attaching bonding wires. This is at the same time associated with a considerable cost saving in terms of manufacturing technology, especially since a large number of manufacturing steps involved in selective application of thick gold coatings where $d_G$>0.5 µm are eliminated.

In a preferred embodiment of the invention, the multilayer metal coating in addition to the gold layer also comprises an interlayer of diffusion-inhibiting material. This diffusion-inhibiting material on the one hand prevents gold from combining with the underlying metal of the metallic components of the semiconductor device, so that it is no longer available for bonding or soldering, and on the other hand also protects against copper diffusing into the compound of solder tin and gold or of bonding material and gold which is forming, causing these compounds to become brittle.

Furthermore, in a preferred embodiment of the invention, the multilayer metal coating may have as interlayer a layer sequence made up of nickel with a thickness $d_N$ and palladium with a thickness $d_P$. In this case, the thickness $d_N$ of nickel is between 3 µm≦$d_N$≦5 µm, and the thickness $d_P$ of palladium is between 0.1 µm≦$d_P$≦0.3 µm. The combination of nickel and palladium has the advantage that it is impossible for any intermetallic phases to form between nickel, as diffusion-inhibiting material, and the gold layer. This is prevented by the second interlayer of palladium or by further interlayers.

Finally, it is possible to provide an interlayer of NiCo with a thickness $d_{NiCo}$ of between 3 µm≦$d_{NiCo}$≦5 µm for the multilayer metal coating. The interlayer of NiCo has the advantage that it can serve as a diffusion barrier both in one direction, for example from a copper component to the gold layer and in the opposite direction from the gold layer to the copper component, and moreover the NiCo interlayer improves the adhesion of the gold layer to the component and therefore represents a bonding agent between the copper component and the gold layer. The adhesion or bonding of the multilayer metal coating can also be improved by a titanium layer on the metallic component of the semiconductor device, in which case tungsten can also be used as barrier layer for nickel. As an alternative to the NiCo layer, it is also possible to use a layer sequence made up of cobalt and palladium, in which case cobalt is arranged in a thickness $d_{Co}$ of 3 µm≦$d_{Co}$≦5 µm on the metallic component.

In a preferred embodiment of the invention, the semiconductor device is a radiofrequency power device with a cavity housing and a metallic base region which includes the multilayer metal coating with gold layer. In particular in the case of power devices which evolve high heat losses, it is crucial that there should be no diffusion between the gold layer and the metal of the metallic component arranged beneath it.

In a further preferred embodiment of the invention, the metallic base region has a base flange which is soldered into a cavity housing frame. This base flange includes copper and/or a copper alloy. The base flange is arranged in such a manner in the cavity housing frame that the multilayer metal coating with gold layer faces the cavity of the cavity housing.

This structure has the advantage that as a result of a new type of coating of the cavity housing frame, the coating likewise comprising a gold layer according to the invention to terminate it, it is now possible to produce a surface-to-surface connection between cavity housing frame with special coating and the base flange with coating according to the invention using a simple tin solder.

Furthermore, the base flange preferably has the multilayer metal coating according to the invention with gold layer on a surface which faces a semiconductor chip. This means that the entire metallic base region can be provided over a large area with the coating according to the invention, and it is now also possible for semiconductor chips made from silicon to be applied to this large-area coating according to the invention prior to assembly with the housing frame. In this case, the base flange is externally heated to a temperature of approximately 430° C., so that a eutectic melt, which mechanically and electrically connects the metallic base region to the back surface of the semiconductor chip, is formed between silicon and the thin gold layer. On the other hand, it is also advantageous if that surface of a component of the semiconductor device which faces the base flange has the multilayer metal coating according to the invention with gold layer.

It is preferable for the base flange to comprise an alloy of copper and tungsten. This alloy has the advantage that it can transmit a higher power loss on account of the tungsten content. At the same time, this alloy allows the application of a diffusion barrier of pure tungsten without requiring an adhesion-promoting layer of titanium.

In another embodiment of the invention, the base flange includes an alloy of copper and molybdenum. This alloy too has the advantage of being able to withstand higher temperatures, making it eminently suitable for radiofrequency power devices.

In another preferred embodiment of the invention, the cavity housing comprises flat conductors. These flat conductors are arranged in the cavity and are embedded in the housing frame and project out of the cavity housing frame, the flat conductors including copper and/or a copper alloy, and having the multilayer metal coating with gold layer being applied to both surfaces of the flat conductors. This has the advantage that in the cavity region the flat conductor ends can receive bonding wires, or it is possible to bond onto these flat conductor ends, while the bottom surfaces of the flat conductors can be soldered in the outer region to a higher-level printed circuit board. Therefore, the multilayer metal coating according to the invention with a gold layer allows versatile use, firstly for bonding, secondly for soldering and finally for fixing silicon semiconductor chips, as mentioned above. Therefore, the semiconductor device can be soldered by way of its flat conductors comprising copper and/or a copper alloy with multilayer metal coating and gold layer, onto a higher-level printed circuit board, without the gold layer first having to be etched off by the user, as is disadvantageously the case with conventional gold coatings with a thickness of over 2.5 µm.

In an embodiment of the invention, the cavity housing comprises plastic. A semiconductor device of this type has the advantage that the plastic cavity housing allows a considerable cost saving, especially since plastic housings of this type can be mass-produced using injection-molding processes, whereas expensive sintering processes with corresponding pressure and temperature supply means have to be used for the ceramic cavity housings.

Moreover, it is advantageous that the heat loss can be dissipated to the surroundings via a metallic base region, especially if the remainder of the housing consists not of ceramic, which is customarily used for radiofrequency devices, but rather of the less expensive plastic material.

In a further embodiment of the invention, the housing frame consists of plastic.

In a further embodiment of the invention, the cavity housing comprises a ceramic.

In a further embodiment of the invention, the semiconductor device comprises a housing with ceramic frame which is particularly suitable for radiofrequency devices. The metal coating according to the invention with thin gold layer is successfully and advantageously used for this component too.

A process for producing a semiconductor device with gold coatings includes the following process steps. First of all, metallic or ceramic components of a semiconductor device are produced. This is followed by the multilayer coating of the top surfaces of the components with at least one metallic interlayer. Finally, a gold layer is applied to this metallic interlayer in a thickness $d_G$ where $d_G \leq 0.5$ µm. After the components have been coated in this way, the semiconductor device is assembled using the components with gold layer.

This process has the advantage that all the metallic components can be provided with identical metallic coatings both on their top surface and on their bottom surface, and are available both for soldering and for bonding to connect the components to one another. Consequently, there is no need to provide any difference in the thickness of the gold layer, and moreover the gold layer is reduced to a minimum, so that selective application of the gold layer is not required.

Therefore, this process eliminates the expensive steps which are otherwise required to carry out selective coating of the components with correspondingly thick gold layers. The production of semiconductor devices of this type is thereby simplified, and at the same time costs are saved. In addition, the reliability of soldered connections within the semiconductor device, but also outside the semiconductor device to higher-level printed circuit boards, is improved, since on account of the thin gold layer, embrittlement caused by the formation of intermetallic phases with the solder materials is suppressed.

In a further process step, the top surface is cleaned with alcohol prior to the multilayer coating of the top surfaces of the components with at least one metallic interlayer. This process step has the advantage that the top sides and surfaces are degreased before the multilayer metal coating is applied.

Furthermore, the top surface is sensitized by means of glow discharge techniques prior to the multilayer coating of the top surfaces of the components with at least one metallic interlayer. This sensitizing using a glow discharge technique, together with the cleaning by alcohol, has the effect of easily roughening the top surfaces, thereby improving the bonding between multilayer coating and the top surface of the component.

Furthermore, a plasma pretreatment of the surface of the metallic components by means of metal ion treatment can be carried out prior to the application of an interlayer. The metal ion treatment differs from the glow discharge by virtue of the fact that instead of the electrons which predominantly impinge during the glow discharge, it is now metal ions which impinge on the top surface of the metallic component, with the result that in particular relatively large contaminating particles and corrosion, oxidation and/or sulfidation residues can be polished off.

Highly active PVD processes are preferably used for the multilayer coating of the top surfaces of metallic components with at least one metallic interlayer. Physical vapor deposition processes of this type have the advantage of allowing a high deposition rate irrespective of the melting point of a metal. A PVD process of this type is particularly advantageous in particular for high-melting metals, such as tungsten, nickel or cobalt.

To apply the base flange to a cavity housing frame, following the application of the multilayer metal coating with gold layer, a solder layer is electrodeposited on said gold layer on the base flange, at least in the edge region of the base flange. This electrodeposition of a solder layer has the advantage that a solder layer of uniform thickness can be achieved.

If the metallic component consists of copper or a copper alloy, it is advantageous for Ni in a thickness $d_N$ where 3 µm $\leq d_N \leq$ 5 µm to be applied as first interlayer. Pd can be applied to the first interlayer of Ni in a thickness $d_P$ where 0.1 µm $\leq d_P \leq$ 0.3 µm, as a second interlayer. Whereas the Ni serves as a diffusion barrier, the Pd improves the bonding of the metals to one another. The high affinity of the palladium with respect to the gold layer is particularly advantageous in this context.

Finally, the gold layer is applied to the at least one interlayer in a thickness $d_G \leq 0.5$ µm, preferably with a thickness $d_G$ between 0.3 µm $\leq d_G \leq$ 0.5 µm. This gold layer concludes the multilayer coating according to the invention; this gold layer does not have to be applied selectively, but rather, since it is so thin, can be applied to all the metallic components. The thin gold layer allows both bonding of wires and bonding of semiconductor chips as well as connection of components of the semiconductor device with the aid of soldering technology. Furthermore, an interlayer of NiCo with a thickness of $d_{NiCo}$ where 3 µm $\leq d_{NiCo} \leq$ 5 µm is applied as diffusion barrier layer. This intermetallic compound of Ni and Co has the advantage of a lower melting point, so that it can also be applied using evaporation coating, thereby avoiding the high costs of a PVD process.

To summarize, it can be established that chip mounting and wire bonding require a minimum gold layer thickness on the metallic components. On the other hand, reliable soldered connections in the applications require significantly thinner maximum gold layer thicknesses. Finally, selective gold-plating of components for semiconductor devices is not cost-effective. Also, complete gold-plating of the components, in particular if these are outer contacts, increases the costs to the customer, since it is necessary then to remove the gold and tin-plate the outer contacts.

The multilayer metal coatings according to the invention on metallic components, by contrast, can be deposited over the entire surface in a constant thickness and can be used both for chip mounting, for wire bonding and for soldering in application, so that in this case a multifunctional multilayer metal coating with a minimal gold layer reduces both the costs of producing a semiconductor device and the costs of producing a printed circuit board having corresponding semiconductor devices and also increases the reliability of the semiconductor device.

BRIEF DESCRIPTION OF THE DRAWINGS

The invention will now be explained in more detail with reference to the appended figures.

DETAILED DESCRIPTION

Figure 1:
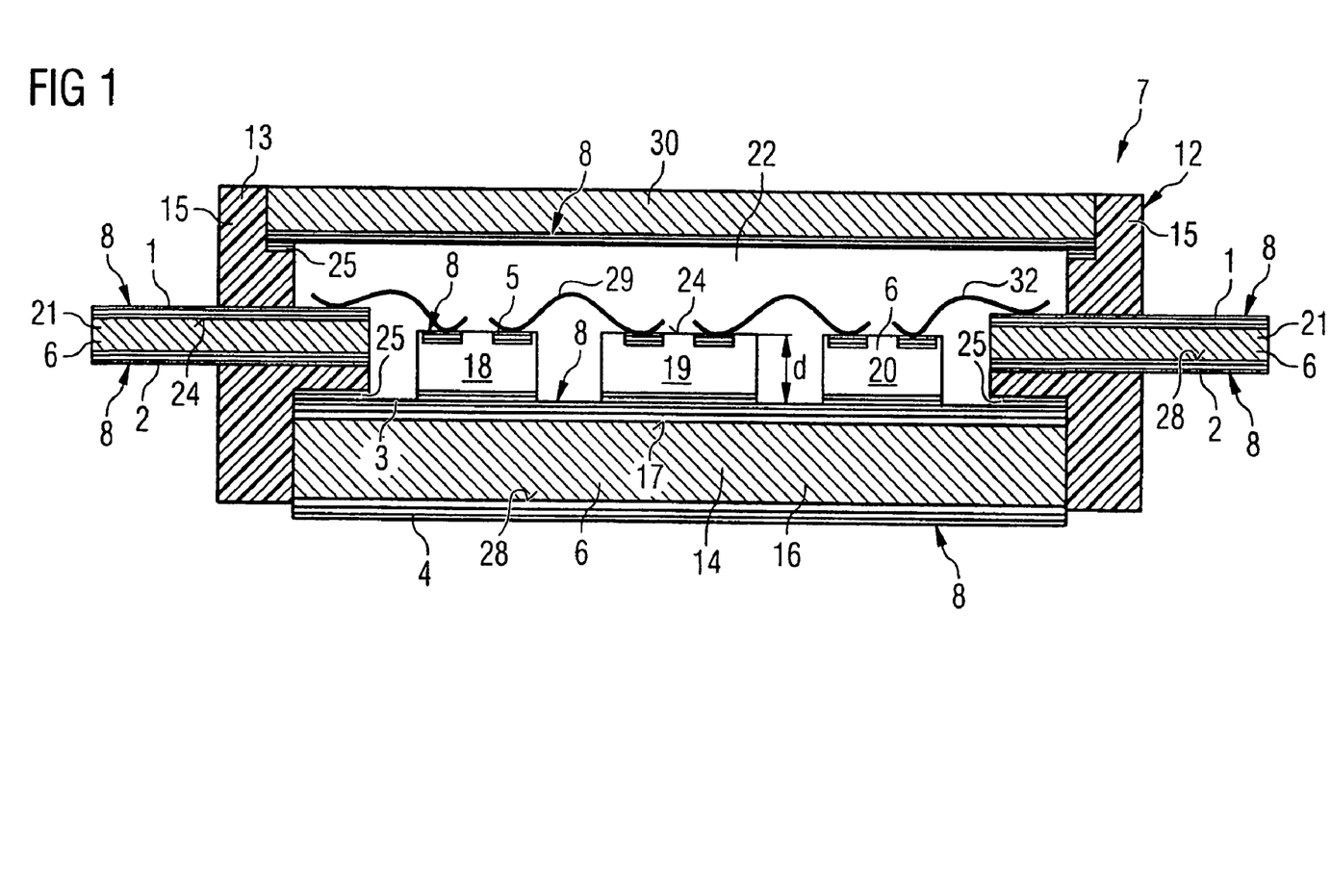
FIG. 1 shows a diagrammatic cross section through a semiconductor device with gold coatings on metallic or semiconducting components of the semiconductor device in accordance with one embodiment of the invention.

FIG. 1 shows a diagrammatic cross section through a semiconductor device 7 with gold coatings 1 to 5 on metallic or semiconducting components 6 of the semiconductor device 7 according to one embodiment of the invention. In this embodiment of the invention, the semiconductor device 7 is a radiofrequency power device which has a cavity housing 12 made from a plastic 13, the cavity housing 12 being composed of three components. One of the components is a metallic base region 14, which comprises a copper plate as base flange 16 which is coated on both sides with a multilayer metal coating 8 according to the invention. This base flange 16 faces the cavity 22 by way of its surface 17 and has a gold coating 3 which is suitable both for soldering with a tin solder and for eutectic soldering with corresponding semiconductor chips 18, 19 and 20.

Apart from the plastic housing 12, this base flange 16 may be coated, both on its surface 17 and on its opposite surface 28, firstly with a coating sequence made up of a plurality of coating layers, with the interlayer being applied first of all and a gold layer being deposited on both sides at the end. Independently of the plastic housing 12, the semiconductor chips 18, 19 and 20 can be alloyed on this base flange 16 with a gold layer of $\leq 0.5$ μm by means of a eutectic melt, which occurs at a solder temperature of approx. 430° C., since the temperature of the eutectic melt is 377° C.

On account of the gold layer according to the invention, a soldering layer can be applied by electrodeposition in the edge regions of the base flange 16, allowing soldering to a special coating of the plastic housing frame 18. For this purpose, two bonding layers of chromium and copper, which are terminated by a diffusion-inhibiting layer of nickel, are applied to the plastic housing frame. If the component 6 or the base flange 16 is brought into contact with a solder layer in the edge region on the gold layer at a suitable solder melting point, the base flange 16 is mechanically and electrically connected to the plastic housing frame 15 without additional anchoring elements having to be provided.

In addition to the base flange 16, as further metallic components the semiconductor device 7 has flat conductors 21 formed from a copper alloy. The flat conductors 21 are arranged with a first end in the cavity 23 of the cavity housing 12, while a middle region is embedded in the cavity housing frame 15 made from plastic, and a second end of the flat conductors projects out of the plastic housing to act as outer contacts. Before the flat conductors 21 are embedded in the plastic housing frame 15 of the cavity housing 12, the flat conductors 21 are provided with the coating according to the invention over a large area.

In this case too, it is provided that the flat conductors be coated on both sides with the metallic coating 8 according to the invention, in order on the one hand to allow bonding in the interior of the cavity 22 and on the other hand to allow the bottom surface 28 of the flat conductors 21 to be attached to a higher-level printed circuit board. Therefore, identical coatings are applied over a large area to the top and bottom surfaces (24, 28) of the flat conductors and to the top and bottom surfaces (24, 28) of the base flange, and there is no need to use selective application processes, which are cost-intensive.

Thereafter, these components 6 are secured in an injection-molded frame by means of an injection-molding technique, with the flat conductors 21 being embedded in the injection-molded frame while the base flange 16 is soldered to the cavity housing frame 15 made from plastic 13, by forming a solder layer 25. Thereafter, the semiconductor chips 18, 19 and 20 arranged on the base flange 16 are available for connection to bonding wires 32. Gold coatings 5, which serve as contact surfaces and include a multilayer metal coating 8 in the same way as the other metallic components 6, are arranged on the top surfaces 24 of the semiconductor chips 18, 19 and 20. It is now possible to produce bonding connections 29 between the multilayer metal coatings 8, thereby providing a radiofrequency power semiconductor device 7 having a plastic housing 12.

To shield the semiconductor chips 18, 19 and 20, a metallic cover 30, which on its side facing the cavity 22 likewise has a multilayer metal coating 8 according to the invention and is soldered to the plastic housing frame 15 by means of a soldering layer 25 as already mentioned above, can be applied to the plastic housing frame 15. This metallic cover 30 at the same time shields the radiofrequency power device from interfering radiation.

Figure 2:
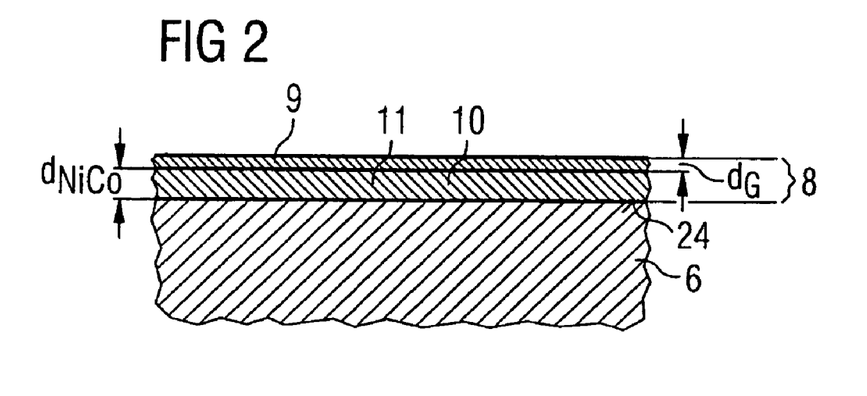
FIG. 2 shows a diagrammatic cross section through a metallic component of a semiconductor device with an interlayer and a gold layer.

FIG. 2 shows a diagrammatic cross section through a metallic component 6 of a semiconductor device having a metallic interlayer 10 and a gold layer 9. The interlayer 10 has been applied to the top surface 24 of the metallic component 6 and in the present exemplary embodiment consists of NiCo with a thickness $d_{NiCo}$ of between 3 μm $\leq d_{NiCo} \leq$ 5 μm. The gold layer 9 has been applied in a thickness $d_G \leq 0.5$ μm to this interlayer 10 of diffusion-inhibiting material 11. This layer combination, which can be applied uniformly to all the metallic components 6 of a semiconductor device, in particular a radiofrequency power device, reduces costs on account of the uniform form of deposition of the individual metal layers of this multilayer metal coating 8.

Figure 3:
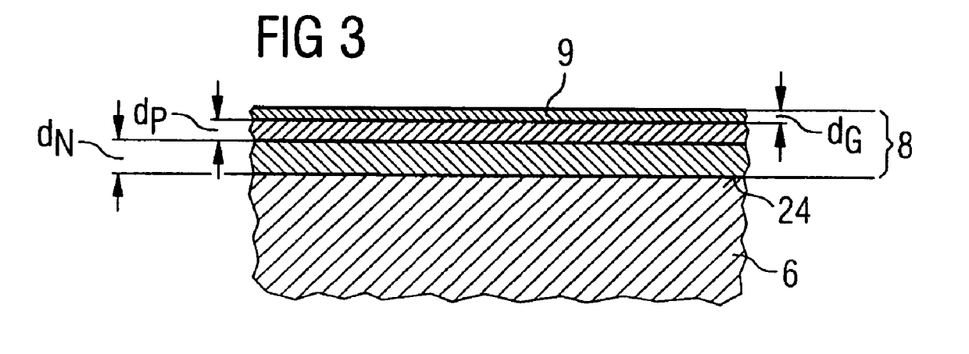
FIG. 3 shows a diagrammatic cross section through a metallic component of a semiconductor device with two interlayers and a gold layer.

FIG. 3 shows a diagrammatic cross section through a metallic component 6 of a semiconductor device with two interlayers 10 and a gold layer 9. In this case, the first interlayer 10, which has been applied direct to the top surface 24 of the metallic component 6, consists of nickel or a nickel alloy and has a thickness of $d_N$ which is between 3 μm $\leq d_N \leq$ 5 μm, while a metal layer of palladium with a thickness $d_P$ of between 0.1 $\leq d_P \leq$ 0.3 μm has been applied above it. A coating of this type can be applied to one side of the metallic component 6, as shown in FIG. 3, or to both sides of a metallic component 6, as shown in FIG. 4 below.

Figure 4:
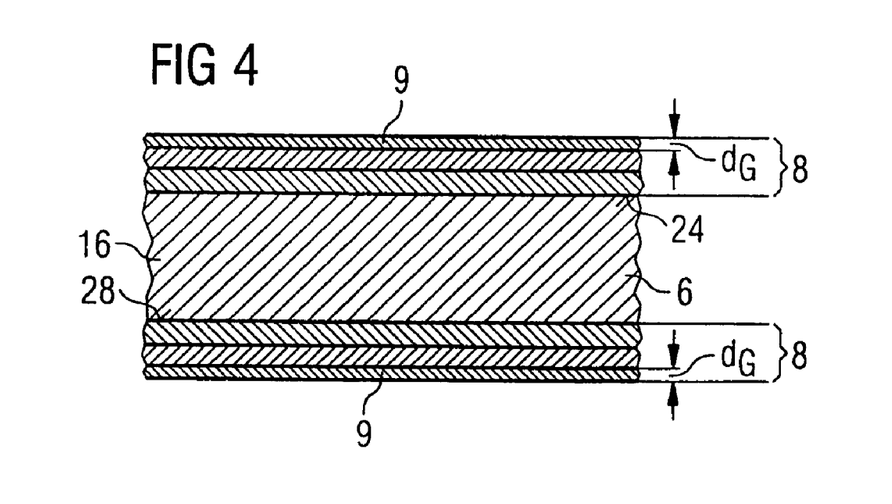
FIG. 4 shows a diagrammatic cross section through a base flange which is coated on both sides.

FIG. 4 shows a diagrammatic cross section through a base flange 16 which has been coated on both sides. Components which have the same functions as in the previous figures are denoted by the same reference designations and are not explained again. The layer sequence of the multilayer metal coating 8 corresponds to the layer sequence shown in FIG. 3, but this device component 6 in the form of a base flange 16 is coated on both sides, so that within the cavity of the cavity housing silicon semiconductor chips can be applied to a top surface 24 of the base flange 16, and in the outer region of the semiconductor device a solder connection to a heat sink 27 is possible on the base flange 16 and on its bottom surface 28.

Figure 5:
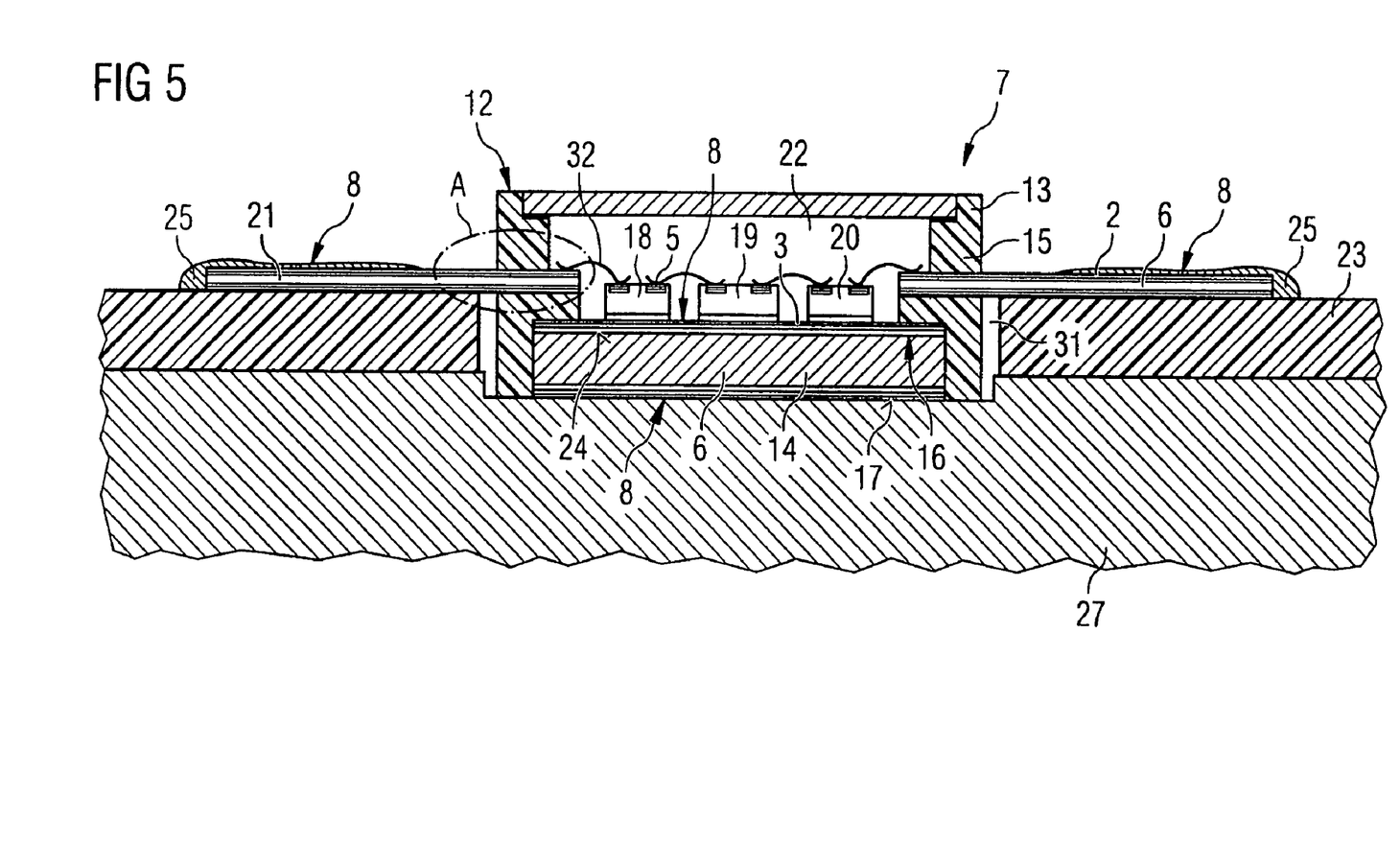
FIG. 5 shows a diagrammatic cross section through a semiconductor device with higher-level printed circuit board and heat sink.

FIG. 5 shows a diagrammatic cross section through a semiconductor device 7 with higher-level printed circuit board 23 and a heat sink 27. Components with the same functions as in the previous figures are denoted by the same reference designations and are not explained again. The higher-level printed circuit board 23 has a cutout 31, so that the semiconductor device 7, as illustrated in FIG. 1, can be soldered, by way of its metallic base region 14 and the multilayer metal coating 8 with gold layer, directly to the heat sink 27 made from a heat-conducting metal.

Figure 6:
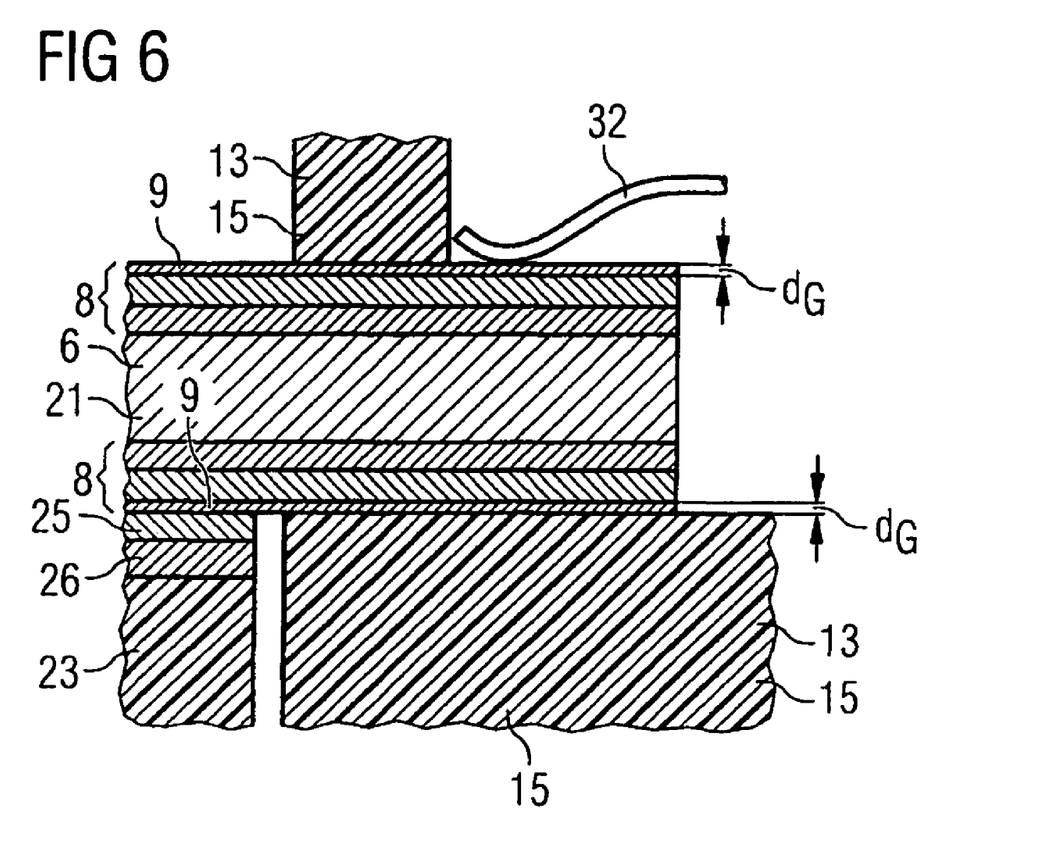
FIG. 6 shows an enlarged view of excerpt A from FIG. 5 with cavity housing frame made from plastic and flat conductors on a printed circuit board.

FIG. 6 shows an enlarged view of excerpt A from FIG. 5, including cavity housing frame 15 made from plastic 13 and a flat conductor 21 on a printed circuit board 23. This FIG. 6 demonstrates the multifunctionality of the gold coating according to the invention, by virtue of the fact that inside the leadframe 13 the multifunctional multilayer metal coating 8 with minimal gold layer 9 is used for the attachment of a bonding wire 32, and outside the cavity housing frame 15 the same identical coating on the bottom surface of the flat conductor 21 is used for soldering onto the higher-level printed circuit board 23.

For this purpose, the higher-level printed circuit board 23 has a copper lamination 26 comprising a layer sequence of chromium, copper and nickel, to which the solder layer 25 can then be applied, forming a close metallic and electrical contact with the multilayer metal coating 8 according to the present invention. Soldering between the plastic material 13 of the housing frame 15 and the flat conductor 21 is not required, since intimate contact with the gold layer of the flat conductor 21 is formed during the injection molding of the cavity housing frame 15. However, the bonding can still be improved if an adhesion-promoting ceramic coating is additionally applied to the gold layer 9.

In a further embodiment of the invention not shown in the figures, the cavity housing frame 15 is ceramic.

LIST OF DESIGNATIONS

1 Gold coating (top surface of flat conductors)
2 Gold coating (bottom surface of flat conductors)
3 Gold coating (top surface of metal bases)
4 Gold coating (bottom surface of a metal base)
5 Coating on bonding contact surface
6 Components of a semiconductor device
7 Semiconductor device
8 Multilayer metal coating
9 Gold layer
10 Metallic interlayer
11 Diffusion-inhibiting material
12 Cavity housing
13 Plastic
14 Base region (metallic)
15 Cavity housing frame
16 Base flange
17 Surface of the base flange (facing the cavity)
18 Semiconductor chip
19 Semiconductor chip
20 Semiconductor chip
21 Flat conductor
22 Cavity
23 Higher-level printed circuit board
24 Top surface of a component
25 Solder layer
26 Copper lamination of the printed circuit board
27 Heat sink
28 Bottom surface of a component
29 Bonding connection
30 Cover
31 Cutout
32 Bonding wire
A Excerpt

What is claimed is:

1. A semiconductor device comprising a multifunctional multilayer metal coating including a gold layer on an entire surface of all metallic and ceramic components of the semiconductor device, wherein the gold layer comprises a thickness less than or equal to 0.5 micrometers, and at least one metallic interlayer is arranged between the gold layer and the components.

2. A semiconductor device according to claim 1, wherein the multilayer metal coating comprises an interlayer of diffusion-inhibiting material.

3. A semiconductor device according to claim 1, wherein the multilayer metal coating as interlayers comprises a layer sequence made up of nickel with a thickness $d_N$ and palladium with a thickness $d_P$, where 3 $\mu m \leq d_N \leq 5$ micrometers and 0.1 $\mu m \leq d_P \leq 0.3$ micrometers.

4. A semiconductor device according to claim 1, wherein the multilayer metal coating as interlayer comprises a layer of NiCo with a thickness $d_{NiCo}$ of 3 micrometers $\leq d_{NiCo} \leq 5$ micrometers.

5. A semiconductor device according to claim 1, wherein the semiconductor device is a radiofrequency power device with a cavity housing and a metallic base region, the metallic base region comprising the multilayer metal coating with gold layer.

6. A semiconductor device according to claim 5, wherein the metallic base region comprises a base flange which is soldered into a cavity housing frame, wherein the base flange comprises copper and/or a copper alloy, the base flange comprising the multilayer metal coating with gold layer on its surface which faces the cavity housing frame.

7. A semiconductor device according to claim 6, wherein the base flange comprises the multilayer metal coating with gold layer on its surface which faces a semiconductor chip.

8. A semiconductor device according to claim 6, wherein the semiconductor device comprises the multilayer metal coating with gold layer on its surface assigned to the base flange.

9. A semiconductor device according to claim 6, wherein the base flange comprises an alloy of copper and tungsten.

10. A semiconductor device according to claim 6, wherein the base flange comprises an alloy of copper and molybdenum.

11. A semiconductor device according to claim 5, wherein the cavity housing comprises flat conductors, which are arranged in the cavity and are embedded in a cavity housing frame and which project out of the cavity housing frame, the flat conductors comprising copper and/or a copper alloy and having the multilayer metal coating with gold layer.

12. A semiconductor device according to claim 11, wherein the semiconductor device is solderable, by way of its flat conductors comprising copper and/or a copper alloy with multilayer metal coating and gold layer, onto a higher-level printed circuit board.

13. A semiconductor device according to claim 5, wherein the cavity housing comprises plastic.

14. A semiconductor device according to claim 5, wherein the semiconductor device comprises a housing with plastic frame.

15. A semiconductor device according to claim 5, wherein the cavity housing comprises ceramic.

16. A semiconductor device according to claim 15, wherein the semiconductor device comprises a housing with a ceramic frame.

17. A semiconductor device comprising:
a plurality of components on a substrate, the components being all of the components of the semiconductor device, each of the components comprising a metal surface;
a first metallic interlayer disposed on an entirety of the metal surfaces of all of the components; and
a gold coating disposed on an entirety of the metallic interlayer, the gold coating having a thickness that is 0.5 micrometers or less.

18. The semiconductor device of claim 17, wherein the first metallic interlayer comprises a diffusion-inhibiting material.

19. The semiconductor device of claim 17, further comprising a second metallic interlayer disposed between the gold coating and the component, wherein the first metallic interlayer comprises nickel and the second metallic interlayer comprises palladium.

20. The semiconductor device of claim 19, wherein the first metallic interlayer has a thickness in a range of 3 micrometers and 5 micrometers, inclusive, and the second metallic interlayer has a thickness in a range of 0.1 micrometers and 0.3 micrometers, inclusive.

21. The semiconductor device of claim 17, wherein the first metallic interlayer comprises NiCo and has a thickness in a range of 3 micrometers and 5 micrometers, inclusive.

22. The semiconductor device of claim 17, comprising a base flange attached to a cavity housing frame, wherein the base flange comprises copper, the first metallic interlayer and the gold coating being disposed on the base flange.

23. The semiconductor device of claim 22, wherein the base flange comprises an alloy of copper and tungsten.

24. The semiconductor device of claim 22, wherein the base flange comprises an alloy of copper and molybdenum.

25. A semiconductor device comprising:
a substrate;
a plurality of semiconductor chips disposed on the substrate;
a first metallic interlayer disposed on the semiconductor chips and the substrate, including on regions of the substrate that are between the substrate and the semiconductor chips; and
a gold coating disposed on the metallic interlayer, the semiconductor chips, and the substrate, including on regions of the metallic interlayer that are between the metallic interlayer and the semiconductor chips, the gold coating having a thickness that is 0.5 micrometers or less.

26. The semiconductor device of claim 25, further comprising a plurality of bonding connections each physically connected to at least two portions of the gold coating.

* * * * *